(12) United States Patent
Schutten et al.

(10) Patent No.: US 7,741,591 B2
(45) Date of Patent: Jun. 22, 2010

(54) OPTICALLY POWERED DRIVE CIRCUIT AND METHOD FOR CONTROLLING A SEMICONDUCTOR SWITCH

(75) Inventors: Michael Joseph Schutten, Rotterdam, NY (US); Robert Louis Steigerwald, Burnt Hills, NY (US); Glen Peter Koste, Niskayuna, NY (US); Jeffrey Joseph Nasadoski, Gloversville, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/287,281

(22) Filed: Oct. 8, 2008

(65) Prior Publication Data

US 2009/0050792 A1 Feb. 26, 2009

Related U.S. Application Data

(62) Division of application No. 11/273,178, filed on Nov. 14, 2005, now Pat. No. 7,449,668.

(51) Int. Cl.
*H03K 17/78* (2006.01)
*G02B 27/00* (2006.01)

(52) U.S. Cl. .................. 250/214 SW; 250/551

(58) Field of Classification Search .......... 250/227.22, 250/227.24, 214 R, 214 SW, 551, 214.1; 385/8, 9; 200/61.02
See application file for complete search history.

(56) References Cited

U.S. PATENT DOCUMENTS

| | | | | |
|---|---|---|---|---|
| 4,129,785 A | | 12/1978 | Kadah | 250/551 |
| 4,833,317 A | | 5/1989 | Huggins | 250/237 |
| 5,475,333 A | * | 12/1995 | Kumagai | 327/530 |
| 5,910,738 A | | 6/1999 | Shinohe et al. | 327/108 |
| 6,018,386 A | | 1/2000 | Radun | 356/213 |
| 6,111,454 A | * | 8/2000 | Shinohe et al. | 327/530 |
| 6,870,405 B2 | | 3/2005 | Visser | 327/108 |
| 7,123,054 B2 | * | 10/2006 | Satou et al. | 326/82 |

* cited by examiner

*Primary Examiner*—Georgia Y Epps
*Assistant Examiner*—Pascal M Bui-Pho
(74) *Attorney, Agent, or Firm*—Penny A. Clarke

(57) ABSTRACT

An optically powered drive circuit and a method for controlling a first semiconductor switch are provided. The optically powered drive circuit includes a photovoltaic cell configured to receive a first light signal from a fiber optic cable and to output a first voltage in response to the first light signal. The optically powered drive circuit further includes an energy storage device electrically coupled to the photovoltaic cell configured to store electrical energy received from the first voltage and to output a second voltage. The optically powered drive circuit further includes an electrical circuit electrically coupled to both the photovoltaic cell and the energy storage device. The electrical circuit is energized by the second voltage. The electrical circuit is configured to receive the first voltage and to output a third voltage in response to the first voltage for controlling operation of the first semiconductor switch.

7 Claims, 11 Drawing Sheets

OPTICALLY POWERED DRIVE CIRCUIT AND METHOD FOR CONTROLLING A SEMICONDUCTOR SWITCH

This is a divisional application of Ser. No. 11/273,178, filed Nov. 14, 2005, entitled "OPTICALLY POWERED DRIVE CIRCUIT AND METHOD FOR CONTROLLING A SEMICONDUCTOR SWITCH".

BACKGROUND OF THE INVENTION

Electrical gate drives have been developed for controlling semiconductor switches used for energizing a load. The gate drive is electrically coupled to an external voltage source via at least two electrical conductors. A drawback with this design is that electromagnetic interference (EMI) can degrade operational performance of the gate drive by inducing undesired voltages and/or currents in the conductor. This condition can create two types of problems: 1) unintentional turn-on or unintentional turn-off of the gate drive, and 2) electromagnetic radiation from high frequency currents flowing down the wires.

The inventors herein have recognized a need for an improved gate drive that can be optically powered and controlled and that reduces and/or eliminates the foregoing deficiencies.

BRIEF DESCRIPTION OF THE INVENTION

An optically powered drive circuit for controlling a first semiconductor switch in accordance with an exemplary embodiment is provided. The optically powered drive circuit includes a photovoltaic cell configured to receive a first light signal from a fiber optic cable and to output a first voltage in response to the first light signal. The optically powered drive circuit further includes an energy storage device electrically coupled to the photovoltaic cell configured to store electrical energy received from the first voltage and to output a second voltage. The optically powered drive circuit further includes an electrical circuit electrically coupled to both the photovoltaic cell and the energy storage device. The electrical circuit is energized by the second voltage. The electrical circuit is configured to receive the first voltage and to output a third voltage in response to the first voltage for controlling operation of the first semiconductor switch.

A method for controlling a first semiconductor switch utilizing an optically powered drive circuit in accordance with another exemplary embodiment is provided. The optically powered drive circuit includes a photovoltaic cell electrically coupled to both an energy storage device and an electrical circuit. The electrical circuit is electrically coupled to the first semiconductor switch. The method includes receiving a first light signal from a fiber optic cable at the photovoltaic cell and generating a first voltage in response to the first light signal. The method further includes storing energy from the first voltage in the energy storage device and outputting a second voltage from the energy storage device. The method further includes energizing an electrical circuit using the second voltage. The method further includes inducing the first semiconductor switch to transition to a first operational state in response to the first voltage being received by the electrical circuit.

An optically powered drive circuit for controlling a first semiconductor switch in accordance with another exemplary embodiment is provided. The optically powered drive circuit includes a photovoltaic cell configured to receive a first light signal from a first fiber optic cable and to generate a first voltage in response to the first light signal. The optically powered drive circuit further includes a second semiconductor switch configured to receive a second light signal from a second fiber optic cable and to output a second voltage. The optically powered drive circuit further includes an electrical circuit electrically coupled to both the photovoltaic cell and the second semiconductor switch. The electrical circuit is energized by the first voltage. The electrical circuit is configured to output a third voltage for controlling operation of the first semiconductor switch in response to the second voltage.

A method for controlling a first semiconductor switch utilizing an optically powered drive circuit in accordance with another exemplary embodiment is provided. The optically powered drive circuit includes a photovoltaic cell electrically coupled to an electrical circuit. The electrical circuit is electrically coupled to the first semiconductor switch. The method includes receiving a first light signal from a first fiber optic cable at the photovoltaic cell and generating a first voltage in response to the first light signal. The method further includes receiving a second light signal from a second fiber optic cable at a second semiconductor switch and outputting a second voltage from the second semiconductor switch in response to the second light signal. The method further includes energizing an electrical circuit using the first voltage. The method further includes inducing the first semiconductor switch to transition to a first operational state in response to the second voltage being received by the electrical circuit.

DETAILED DESCRIPTION OF THE INVENTION

Figure 1:
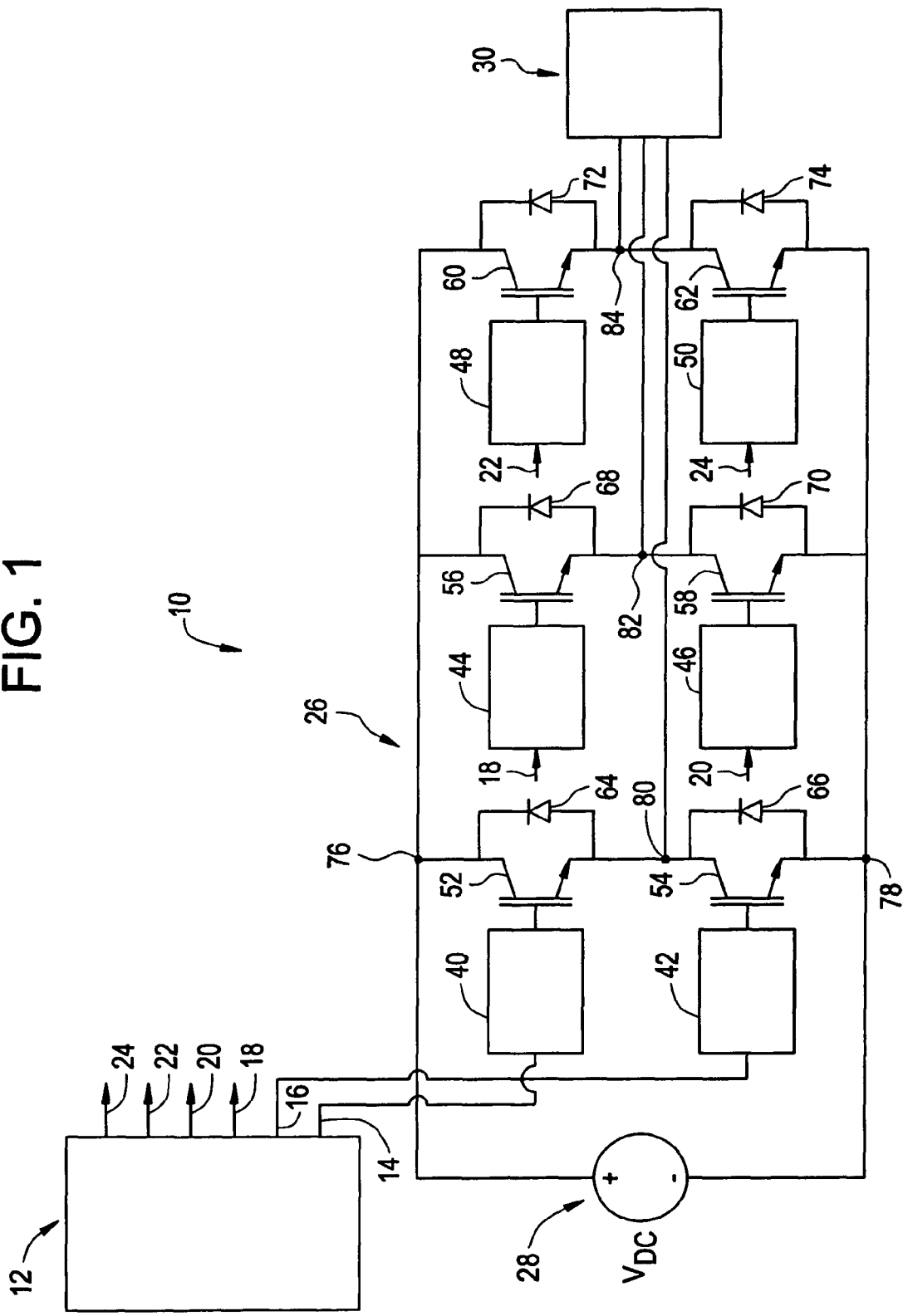
FIG. 1 is a schematic of a control system utilizing a plurality of optically powered drive circuits in accordance with an exemplary embodiment.

Referring to FIG. 1, a schematic of a control system 10 for controlling an electrical load 30 that utilizes a plurality of optically powered drive circuit in accordance with an exemplary embodiment is shown. The control system includes a light source 12, a plurality of fiber optic cables 14, 16, 18, 20, 22, 24, a three phase inverter 26, a voltage source 28, and an electrical load 30.

The light source 12 is provided to generate a plurality of light beams for propagation through fiber optic cables 14, 16, 18, 20, 22, 24 in order to control operation of three phase inverter 26. The light source 12 is optically coupled to the three phase inverter 26 through fiber optic cables 14, 16, 18, 20, 22, 24. It should be noted that in an alternative embodiment, fiber optic cables 14, 16, 18, 20, 22, 24 can contain more than one optical fiber thereby allowing a plurality of light beams to travel through one fiber optic cable.

The three-phase inverter 26 is provided for generating signals at nodes 80, 82, 84 for controlling the electrical load 30. The three phase inverter 26 includes optically powered gate drive circuits 40, 42, 44, 46, 48, 50, transistors 52, 54, 56, 58, 60, 62, and diodes 64, 66, 68, 70, 72, 74. The transistors 52, 54, 56, 58, 60, 62 are provided for generating signals in order to control the electrical load 30. Because transistors 52, 54, 56, 58, 60, 62 operate in a substantially similar way, only the operation of transistor 52 will be explained in detail for purposes of simplicity. During operation, transistor 52 switches between two operational states in response to a voltage being generated from the optically powered drive circuit 40. In a first operational state, the transistor 52 behaves like an open circuit allowing only a relatively small amount of current to flow between nodes 76 and 80 through the transistor 52. In a second operational state, the transistor 52 behaves like a short circuit allowing a relatively large amount of current to flow between nodes 76 and 80. The transistor 52 is turned on when it is operating in the first operational state and turned off when it is operating in the second operational state. The diodes 64, 66, 68, 70, 72, 74 are provided to allow currents to flow in an anti-parallel path across transistors 52, 54, 56, 58, 60, 62 respectively. The three-phase inverter 26 is electrically coupled to the voltage source 28 at nodes 76 and 78 and to the electrical load 30 at the nodes 80, 82, and 84.

The voltage source 28 is provided to supply electrical energy in order to power portions of the three-phase inverter 26. The voltage source 28 is electrically coupled to the three-phase inverter 26 at the nodes 76 and 78 and is configured to generate a voltage across nodes 76 and 78.

The electrical load 30 is provided to process electrical energy using the electrical pulses supplied by the three phase inverter 26. The electrical load 30 is electrically coupled to the three phase inverter 26 at nodes 80, 82, and 84.

The optically powered drive circuits 40, 42, 44, 46, 48, 50 are provided for controlling the operation of transistors 52, 54, 56, 58, 60, 62 respectively. Light beams from the light source 12 propagate through fiber optic cables 14, 16, 18, 20, 22, 24 and are received by the optically powered drive circuits 40, 42, 44, 46, 48, 50 respectively. The light beams provide electrical energy in order to power the optically powered drive circuits 40, 42, 44, 46, 48, 50. Further, the light beams provide control signals for inducing the optically powered drive circuits 40, 42, 44, 46, 48, 50 to control the operational state of the transistors 52, 54, 56, 58, 60, 62 respectively. Because the structure of optically powered drive circuit 40 is substantially similar to the structure of optically powered drive circuits 42, 44, 46, 48, 50, only a detailed explanation of optically powered drive circuit 40 will be provided.

For purposes of discussion, the voltages referred to in FIGS. 2, 3, 4, and 13 are referenced from node 80, unless otherwise specified.

Figure 2:
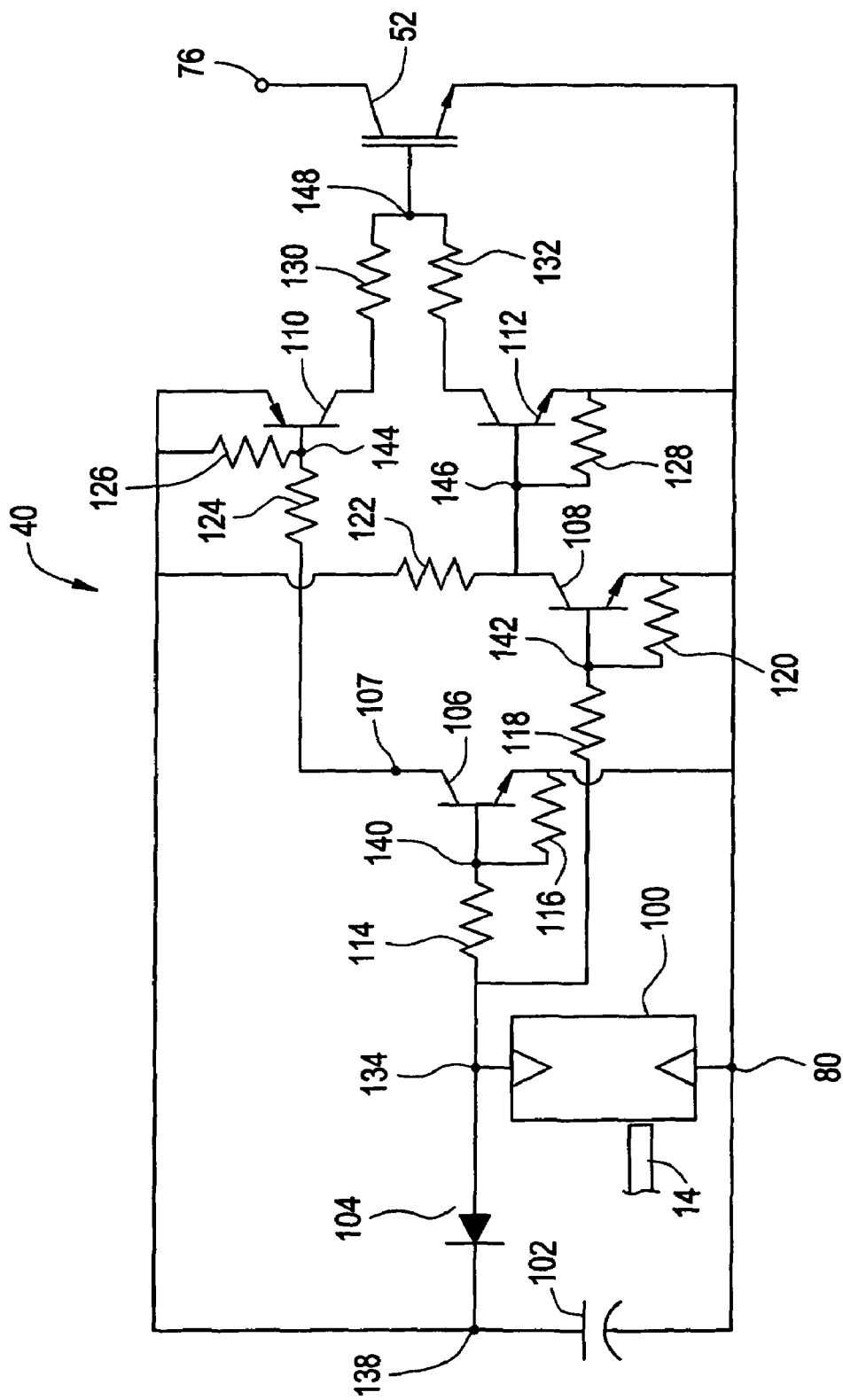
FIG. 2 is a schematic of an optically powered drive circuit utilized in the control system of FIG. 1 in accordance with an exemplary embodiment.

Referring to FIG. 2, a schematic of the optically powered drive circuit 40 utilized in control system 10 is shown. The optically powered drive circuit 40 includes a photovoltaic cell 100, a capacitor 102, a diode 104, transistors 106, 108, 110, 112, and resistors 114, 116, 118, 120, 122, 124, 126, 128, 130, 132.

The photovoltaic cell 100 is provided for converting light energy received from the fiber optic cable 14 into electrical energy and generating a voltage between nodes 134 and 80. The photovoltaic cell 100 outputs a voltage corresponding to a high voltage at node 134 when light is being received from the fiber optic cable 14 and outputs a low voltage at node 134 when light is not being received by the fiber optic cable 14.

The capacitor 102 is provided for storing electrical energy generated by the photovoltaic cell 100. The capacitor 102 is electrically coupled to the photovoltaic cell at the node 80 and to the diode 104 at the node 138.

The diode 104 is provided to prevent the capacitor 102 from discharging when the photovoltaic cell 100 is not receiving light from the fiber optic cable 14. The anode of diode 104 is electrically coupled to the photovoltaic cell 100 at the node 134. The cathode of diode 104 is electrically coupled to the capacitor 102 at the node 138. The diode 104 is configured to allow current to flow from the photovoltaic cell 100 to the capacitor 102.

The transistors 106, 108, 110, 112 are provided for switching transistor 52 between two operational states based upon the voltage at the node 134. The transistors 106, 108, 110, 112 behave as electrical switches transitioning between two different operational states depending on the voltage between the base and emitter of each transistor. Transistors 106, 108, and 112 are NPN transistors and transistor 110 is a PNP transistor. An NPN transistor, such as transistor 106, will turn on when a high voltage is received at node 134 relative to the emitter node 80. When the transistor 106 is turned on, it will pass a relatively large amount of current between nodes 107 and 80. The transistor 106 will turn off when a low voltage is received at node 134 relative to the emitter node 80. When the transistor 106 is turned off, it will not pass current between nodes 107 and 80. The transistors 108 and 112 are also NPN transistors and operate in a similar fashion to transistor 106. A PNP transistor, such as a transistor 110, will turn on when a low voltage is received at node 107. When the transistor 110 is turned on, it will pass a relatively large amount of current between nodes 138 and 148. The transistor 110 will turn off when transistor 106 is off, and resistor 126 keeps the base node 144 at the voltage potential of node 138. When the transistor 110 is turned off, it will not pass current between nodes 138 and 148.

The transistor 110 is provided to charge the node 148 to a voltage level suitable to induce transistor 52 to turn on. The transistor 112 is provided to discharge node 148 to a voltage suitable to induce the transistor 52 to turn off. The transistor 106 is provided to induce the transistor 110 to turn on when a high voltage is received at the node 134 and to induce the transistor 110 to turn off when a low voltage is received at the node 134. The transistor 108 is provided to induce the transistor 112 to turn off when a high voltage is received at the node 134 and to induce the transistor 112 to turn on when a low voltage is received at the node 134.

The transistor 106 is electrically coupled to a node 140 at a base terminal, a node 80 at an emitter terminal, and a node 107 at its collector terminal. The transistor 108 is electrically coupled to node 142 at the base terminal, node 80 at the emitter terminal, and a node 146 at the collector terminal. The transistor 110 is electrically coupled to the node 144 at the base terminal, a node 138 at the emitter terminal, and a node 148 through a resistor 130 at the collector terminal. The transistor 112 is electrically coupled to a node 146 at the base terminal, the node 80 at the emitter terminal and a node 148 through resistor 132 at the collector terminal.

The resistor 114 is connected in series between the nodes 134 and 140. The resistor 116 is connected in series between the nodes 140 and 80. The resistor 118 is connected in series between nodes 134 and 142. The resistor 120 is connected in series between the nodes 142 and 80. The resistor 122 is connected in series between the nodes 138 and 146. The resistor 124 is connected in series between the node 144 and the node 107. The resistor 126 is connected in series between the nodes 138 and 144. The resistor 128 is connected in series between the nodes 146 and 80. The resistor 130 is connected in series between the node 148 and the collector of transistor 110. The resistor 132 is connected in series between the node 148 and the collector of transistor 112.

The operation of the optically powered drive circuit 40 will now be explained. When the photovoltaic cell 100 receives light from the fiber optic cable 14, the photovoltaic cell 100 converts the light energy into a voltage between the nodes 134 and 80 corresponding to a high voltage at node 134 relative to node 80. The diode 104 allows the voltage at the node 134 to charge the capacitor 102 generating a high voltage at node 138. The high voltage at the node 134 induces transistors 106 and 108 to turn on. When the transistors 106 and 108 turn on, there is a base current causing the transistor 110 to turn on, and the transistor 112 is turned off because it has no base current. The transistor 110 allows current to pass from the node 138 to the node 148 charging node 148, relative to node 80, to a voltage sufficient to induce transistor 52 to turn on.

Similarly, when the photovoltaic cell 100 does not receive light from the fiber optic cable 14, the photovoltaic cell 100 generates a low voltage at the node 134 relative to node 80. The diode 104 prevents the capacitor 102 from being discharged through the node 134. The low voltage at the node 134 induces the transistors 106 and 108 to turn off. When the transistors 106 and 108 turn off, transistor 110 turns off and transistor 112 turns on. The transistor 112 allows current to pass from the node 148 to the node 80 discharging the node 148 to a voltage sufficient to induce transistor 52 to turn off.

Figure 3:
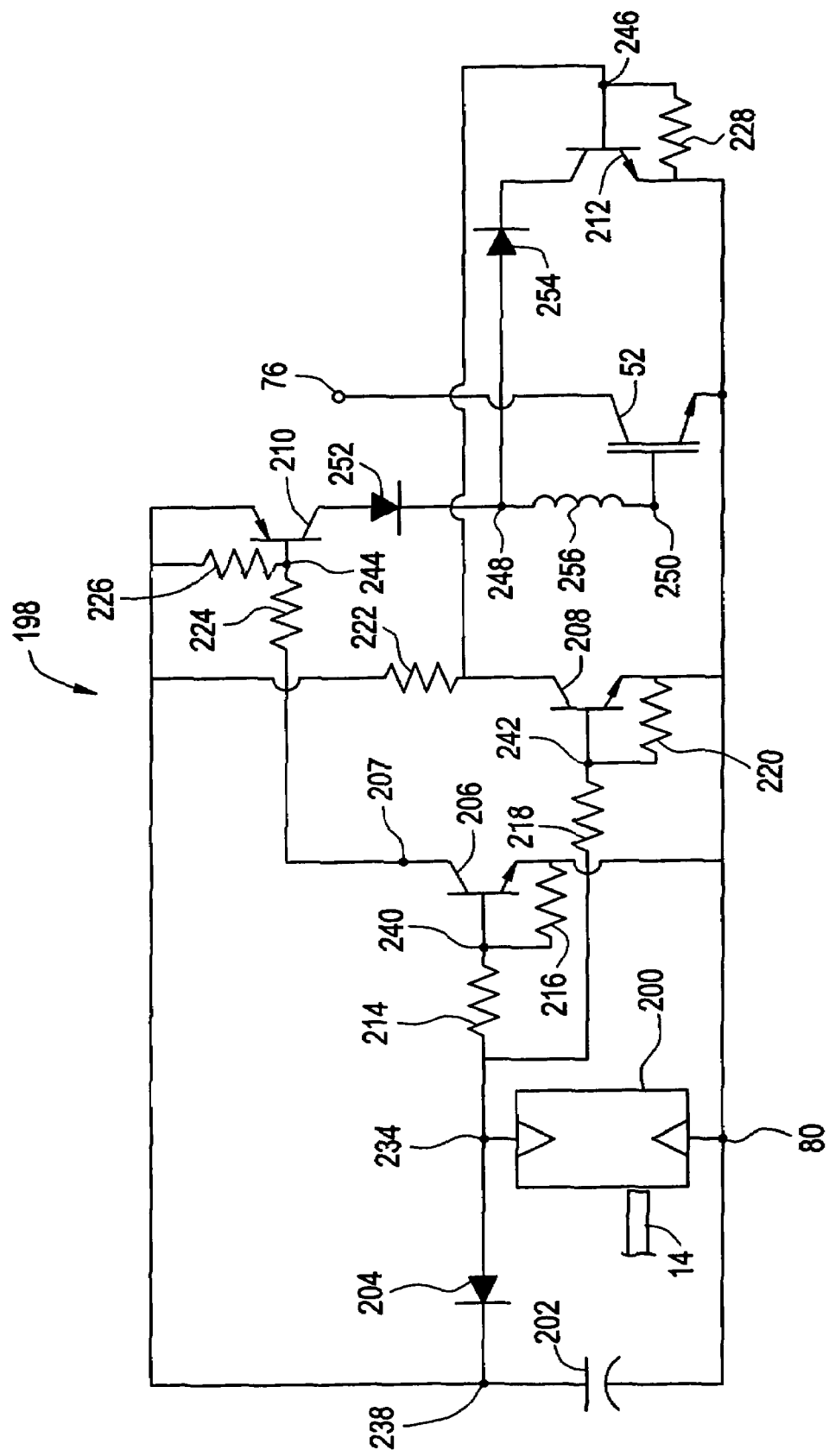
FIG. 3 is a schematic of a resonant optically powered drive circuit in accordance with another exemplary embodiment.

Referring to FIG. 3, a schematic of a resonant optically powered drive circuit 198 that can be utilized in control system 10 instead of the optically powered drive circuit 40 in accordance with another exemplary embodiment is shown. The optically powered drive circuit 198 includes a photovoltaic cell 200, a capacitor 202, diodes 204, 252, 254, an inductor 256, transistors 206, 208, 210, 212, and resistors 214, 216, 218, 220, 222, 224, 226, 228. For purposes of discussion, the gate node 250 and the emitter node 80 of the transistor 52 behave like a capacitor. This capacitance includes the transistor 52 base 148 to emitter 80 capacitance and also includes the effective miller capacitance between the gate node 250 and the collector 76 of the transistor 52.

The photovoltaic cell 200 is provided for converting light energy received from the fiber optic cable 14 into electrical energy by generating a voltage between the nodes 234 and 80. The photovoltaic cell 200 outputs a high voltage at the node 234 relative to node 80, when light is being received from the fiber optic cable 14 and outputs a low voltage at the node 234 when light is not being received by the fiber optic cable 14.

The capacitor 202 is provided for storing electrical energy generated by the photovoltaic cell 200. The capacitor 202 is electrically coupled to the photovoltaic cell at the node 80 and to the diode 204 at the node 238.

The diode 204 is provided to prevent the capacitor 202 from discharging when the photovoltaic cell 200 is not receiving light from the fiber optic cable 14. The anode of diode 204 is electrically coupled to the photovoltaic cell 200 at the node 234. The cathode of diode 204 is electrically coupled to the capacitor 202 at the node 238. The diode 204 is configured to allow current to flow from the photovoltaic cell 200 to the capacitor 202.

The transistors 206, 208, 210, 212 are provided for switching the transistor 52 between two operational states based upon the voltage at node 234. The transistors 206, 208, and 212 are NPN transistors and operate in a manner similar to transistor 106 described above. The transistor 210 is a PNP transistor and operates in a manner similar to transistor 110 described above.

The transistor 210 is provided to supply a voltage to the node 248 and consequently the node 250 to a voltage level suitable to induce the transistor 52 to turn on. The transistor 212 is provided to supply a voltage to the node 248 and consequently the node 250 suitable to induce the transistor 52 to turn off. The transistor 206 is provided to induce transistor 210 to turn on when a high voltage is received at the node 234 and to induce the transistor 210 to turn off when a low voltage is received at the node 234. The transistor 208 is provided to induce the transistor 212 to turn off when a high voltage is received at the node 234 and to induce the transistor 212 to turn on when a low voltage is received at the node 234.

The transistor 206 is electrically coupled to a node 240 at the base terminal, a node 80 at the emitter terminal, and a node 207 at the collector terminal. The transistor 208 is electrically coupled to a node 242 at a base terminal, a node 80 at an emitter terminal, and a node 246 at a collector terminal. The transistor 210 is electrically coupled to a node 244 at a base terminal, a node 238 at an emitter terminal, and a node 248 through a diode 252 at a collector terminal. The transistor 212 is electrically coupled to a node 246 at a base terminal, a node 80 at an emitter terminal and a node 248 through a diode 254 at a collector terminal.

The inductor 256 is provided to resonantly charge a node 250 to a voltage greater than the voltage at the node 248 when the transistor 210 is turned on and to discharge the node 250 to a voltage less than the voltage at the node 248 when the transistor 212 is turned on. The inductor is electrically coupled in series between the nodes 248 and 250. The resonant circuit includes the inductor 256 and the base 250 to emitter 80 capacitance of the transistor 52, and base 250 to collector 76 capacitance.

The diodes 252 and 254 are provided to allow only a positive resonant pulse of current to flow into the base node 250 of the transistor 52 when transistor 210 is turned on, and only a negative pulse of current to flow into the base 250 when transistor 212 is turned on. The diode 252 is electrically coupled to the collector of the transistor 210 at the anode terminal and to the node 248 at the cathode terminal. The diode 252 is configured to allow current to pass from the transistor 210 to the inductor 256. The diode 254 is electrically coupled to the node 248 at the anode terminal and to the collector of the transistor 212 at the cathode terminal. The diode 254 is configured to allow current to pass from the inductor 256 to the transistor 212.

The resistor 214 is connected in series between nodes 234 and 240. The resistor 216 is connected in series between nodes 240 and 80. The resistor 218 is connected in series between nodes 234 and 242. The resistor 220 is connected in series between nodes 242 and 80. The resistor 222 is connected in series between nodes 238 and 246. The resistor 224 is connected in series between node 244 and node 207. The resistor 226 is connected in series between nodes 238 and 244. The resistor 228 is connected in series between nodes 246 and 80.

When the photovoltaic cell 200 receives light from the fiber optic cable 14, the photovoltaic cell 200 converts the light energy into a voltage corresponding to a high voltage at the node 234 relative to node 80. The diode 204 allows the voltage at the node 234 to charge the capacitor 202 generating a high voltage at the node 238. The high voltage at the node 234 induces the transistors 206 and 208 to turn on. When the transistors 206 and 208 turn on, transistor 210 turns on and transistor 212 turns off. The transistor 210 allows current to pass from the node 238 to node 248. The inductor 256 and base emitter (plus base-collector) capacitance of transistor 52 form a resonant L-C circuit. When transistor 210 is turned on, a positive resonant half-pulse of current flows into the inductor 256 charging the node 250 to a voltage sufficient to induce the transistor 52 to turn on. The diode 252 prevents the current in inductor 256 from going negative when transistor 210 is turned on.

Similarly, when the photovoltaic cell 200 does not receive light from the fiber optic cable 14, the photovoltaic cell generates a voltage corresponding to a low voltage at the node 234 relative to node 80. The diode 204 prevents the capacitor 202 from being discharged through the node 234. The low voltage at the node 234 induces the transistors 206 and 208 to turn off. When the transistors 206 and 208 turn off, transistor 210 turns off and transistor 212 turns on. The transistor 212 allows current to pass from the node 248 to the node 80 resonantly discharging the base capacitance of 52 through inductor 256. The inductor 256 and base capacitance of transistor 52 form a resonant L-C circuit. When transistor 212 is turned on, a negative half pulse of current flows in the inductor 256, resonantly discharging the node 250 to a voltage sufficient to induce the transistor 52 to turn off. The diode 254 prevents the current in inductor 256 from going positive when transistor 212 is turned on.

Figure 4:
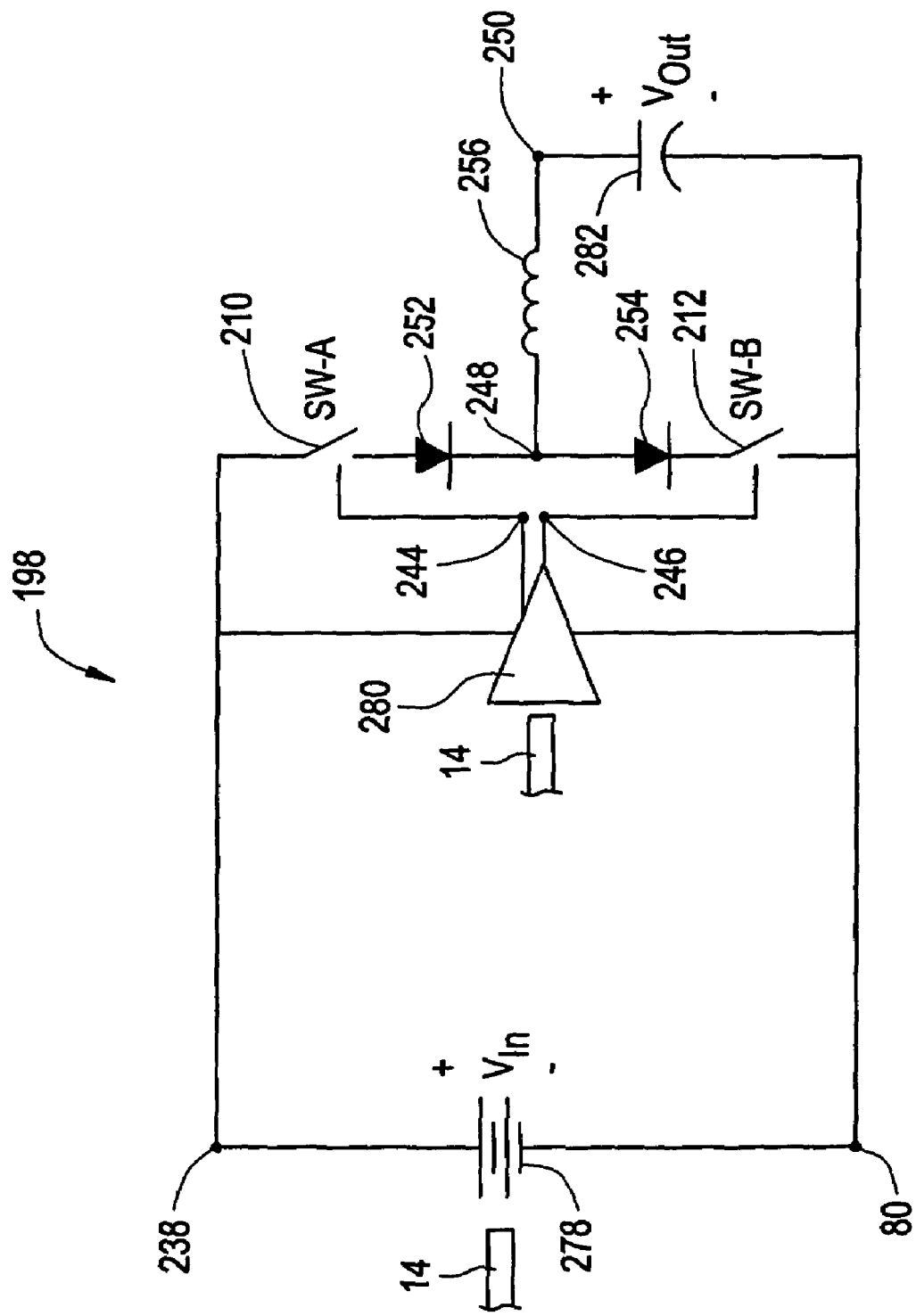
FIG. 4 is a simplified schematic of the resonant optically powered drive circuit of FIG. 3.
Figure 5:
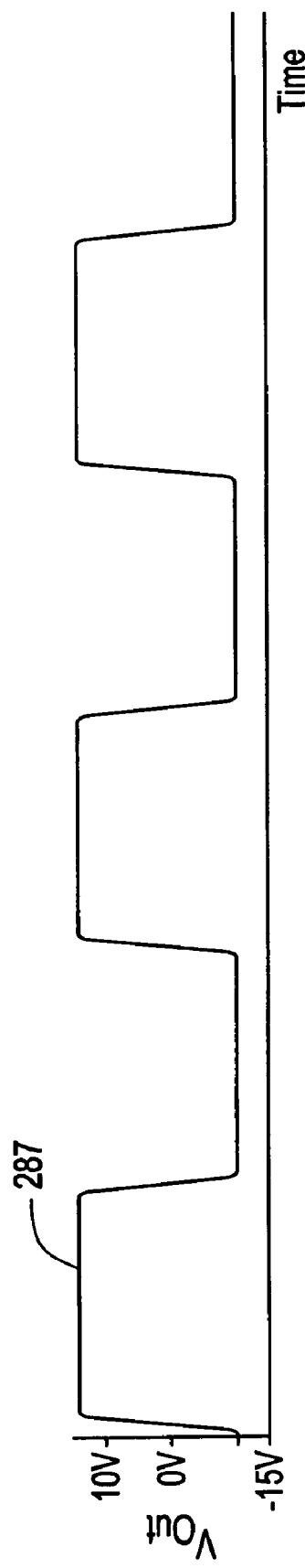
FIG. 5 is a waveform schematic of an output voltage during operation of the resonant optically powered drive circuit of FIG. 3.
Figure 6:
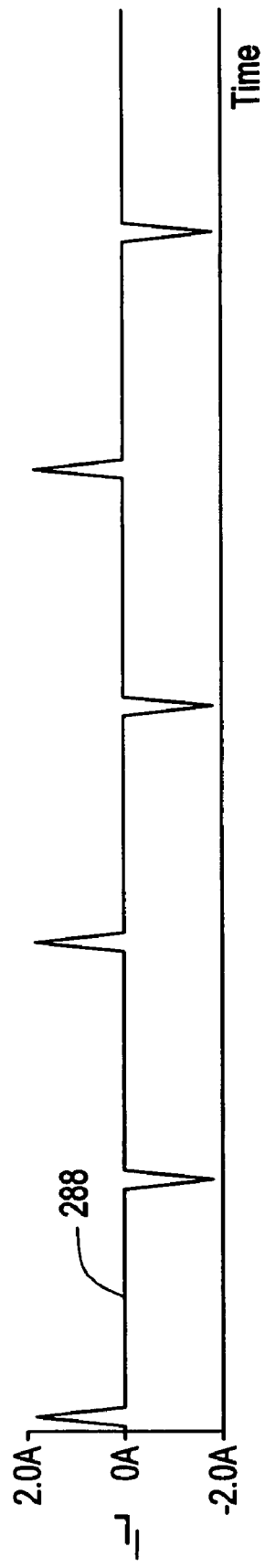
FIG. 6 is a waveform schematic of a current flowing through an inductor during operation of the resonant optically powered drive circuit of FIG. 3.

Referring to FIG. 4, a simplified schematic of the resonant optically powered drive circuit 198 will be utilized to explain the energy recovery functionality of the circuit 198. The optically powered drive circuit 198 includes a voltage source 278, a control circuit 280, switches 210, 212, diodes 252, 254, the inductor 256, an IGBT base capacitance between nodes 250 and 80 represented as a capacitor 282. Several elements illustrated in the optically powered drive circuit 198 of FIG. 3 are not explicitly shown in the simplified schematic in order to better illustrate the operation of the energy recovery feature. For example, the resistors 214, 216, 218, 220, 222, 224, 226, 228 of FIG. 3 are not explicitly shown.

The voltage source 278 includes the combination of the photovoltaic cell 200, diode 204, and capacitor 202. The voltage source 278 is provided for converting light energy received from the fiber optic cable 14 into electrical energy by generating a voltage between nodes 80 and 238. The voltage source is electrically coupled to switches 210 and 212.

The control circuit 280 includes the combination of the photovoltaic cell 200, transistors 206, 208 and the resistors 214, 216, 218, 220, 222, 224, 226, 228. The control circuit 280 is provided for controlling the operation of switches 210 and 212 based upon a light signal received from the fiber optic cable 14. The control circuit is electrically coupled to nodes 80, 238, and 248. The light received by the voltage source 278 and the control circuit 280 is from the fiber optic cable 14. It should be noted that in an alternative embodiment, the voltage source 278 and control circuit 280 may receive light from different optical fibers of fiber optic cable 14.

The capacitor 282 corresponds to base-emitter (and base-collector) capacitance of transistor 52 in the control system 10. Transistor 52 is modeled as a capacitor for the purpose of illustrating the charging and discharging characteristics between the gate and base of transistor 52. Transistor 52 is provided for generating signals in order to control the electrical load 30 in the control system 10.

During operation of the optically powered drive circuit 198, the voltage source 278 receives light from the fiber optic cable 14. The voltage source 278 converts the light energy into electrical energy generating a voltage between the nodes 80 and 238. When light is not received from the fiber optic cable 14, the voltage source 278 continues to output a voltage between nodes 80 and 238 for a period of time until the remaining electrical energy in the energy storage capacitor is dissipated.

The control circuit 280 generates a voltage at the node 244 when light is being received from the fiber optic cable 14 that closes switch 210, and generates a voltage at the node 244 when light is not being received by the fiber optic cable 14 that opens switch 210. Further, the control circuit 280 generates a voltage at the mode 246 when light is being received from the fiber optic cable 14 that opens switch 212, and generates a voltage at the node 246 when light is not being received by the fiber optic cable 14 that closes switch 212.

The energy recovery functionality of the optically powered drive circuit 198 allows the circuit 198 to resonantly charge the capacitor 282 to a voltage greater than the voltage supplied by the voltage supply 278. This gain in voltage is achieved utilizing the diodes 252 and 254, and the inductor 256 as will be explained in greater detail below.

Figure 7:
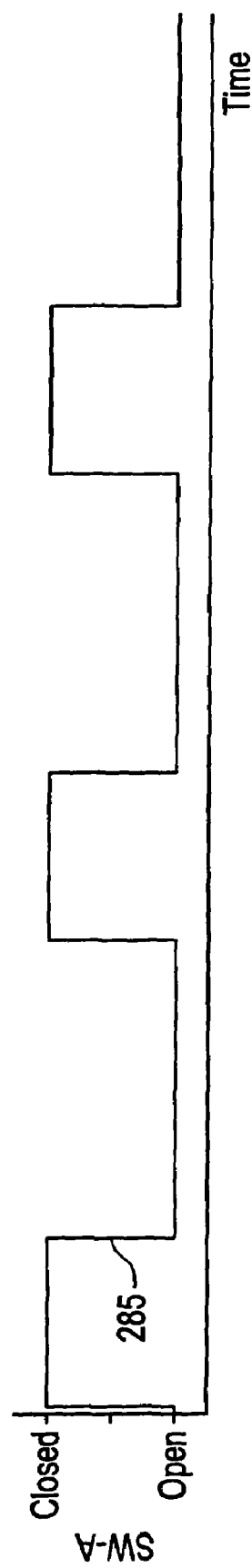
FIG. 7 is a waveform schematic of an operational state of a first switch during operation of the resonant optically powered drive circuit of FIG. 3.
Figure 8:
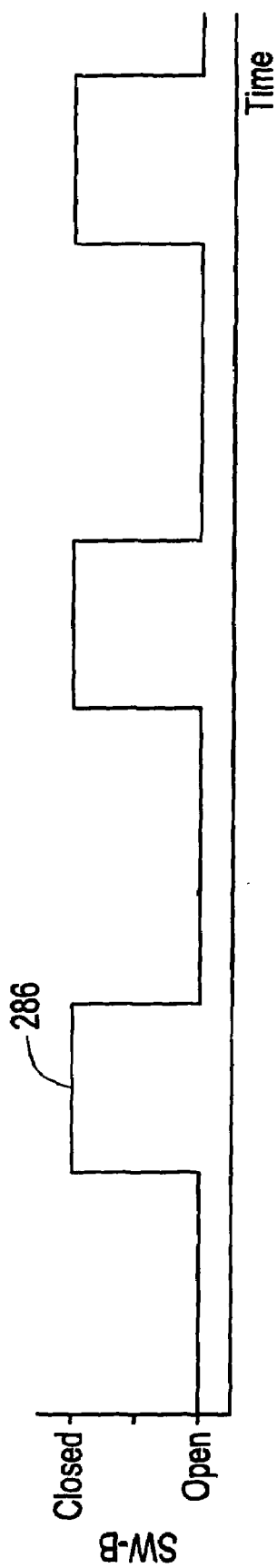
FIG. 8 is a waveform schematic of an operational state of a second switch during operation of the resonant optically powered drive circuit of FIG. 3.

Referring to FIGS. 7 and 8, waveforms 285, 286 illustrating the operation states of switches 210 and 212 respectively, are provided. When the switch 210 is open, it behaves like an open circuit, not allowing current to flow between the nodes 238 and 248. When switch 210 is closed, it behaves like a short circuit, allowing a relatively large amount of current to flow between the nodes 238 and 248. FIGS. 7-8 show that switches 210 and 212 alternate between the open and closed positions. When the switch 210 is closed, the switch 212 is open. Further, when the switch 212 is closed, the switch 210 is open. It should be noted that there is a relatively small portion of time when switches 210 and 212 are both open to avoid the condition where both switches are closed at the same time. Both switches 210 and 212 turned on at the same time would discharge the energy storage capacitor 202.

Referring to FIGS. 5-8, when the switch 210 is closed and the switch 212 is open, a current loop is formed starting at the voltage source 278 through the switch 210, the diode 252, the inductor 256, the capacitor 282 and back to voltage source 278. When the switch 210 is closed, the waveform 287 resonantly transitions from a low voltage level to a high voltage level. The inductor 256 and capacitor 282 form a resonant circuit. Thereafter, the current through the inductor 256 shown by waveform 288 begins to increase for a period of time then decreases back to zero. A positive inductor current indicates that current is flowing from the switch 210 through the diode 252 and the inductor 256 to the node 250. The voltage at the node 250 also resonantly increases while there is a positive current. When the inductor current shown by the waveform 288 returns to zero, the waveform 287 stabilizes at a high voltage. Further, the diode 252 prevents a reverse negative current from flowing and thus prevents the voltage at the node 250 from discharging through the inductor 256. The voltage and current remain stable until the switch 212 closes.

When the switch 210 is open and the switch 212 is closed, a resonant current loop is formed starting at the capacitor 282 traveling through the inductor 256, the diode 254, the switch 212, and returning to the capacitor 282. When the switch 212 is closed, the control waveform 286 transitions from a low voltage to a high voltage. Thereafter, the current through the inductor 256 begins to increase in the negative direction for a period of time then decreases back to zero as shown by waveform 288. A negative inductor current indicates that current is flowing from the node 250 through the diode 254 to the switch 212. The voltage at the node 250 decreases while there is a negative current. When the inductor current shown by waveform 288 returns to zero, the waveform 287 stabilizes at a low voltage. Further, the diode 254 prevents a positive current from flowing and thus prevents the voltage at the node 250 from recharging through the inductor 256. The voltage and current remain stable until switch 210 closes.

Figure 9:
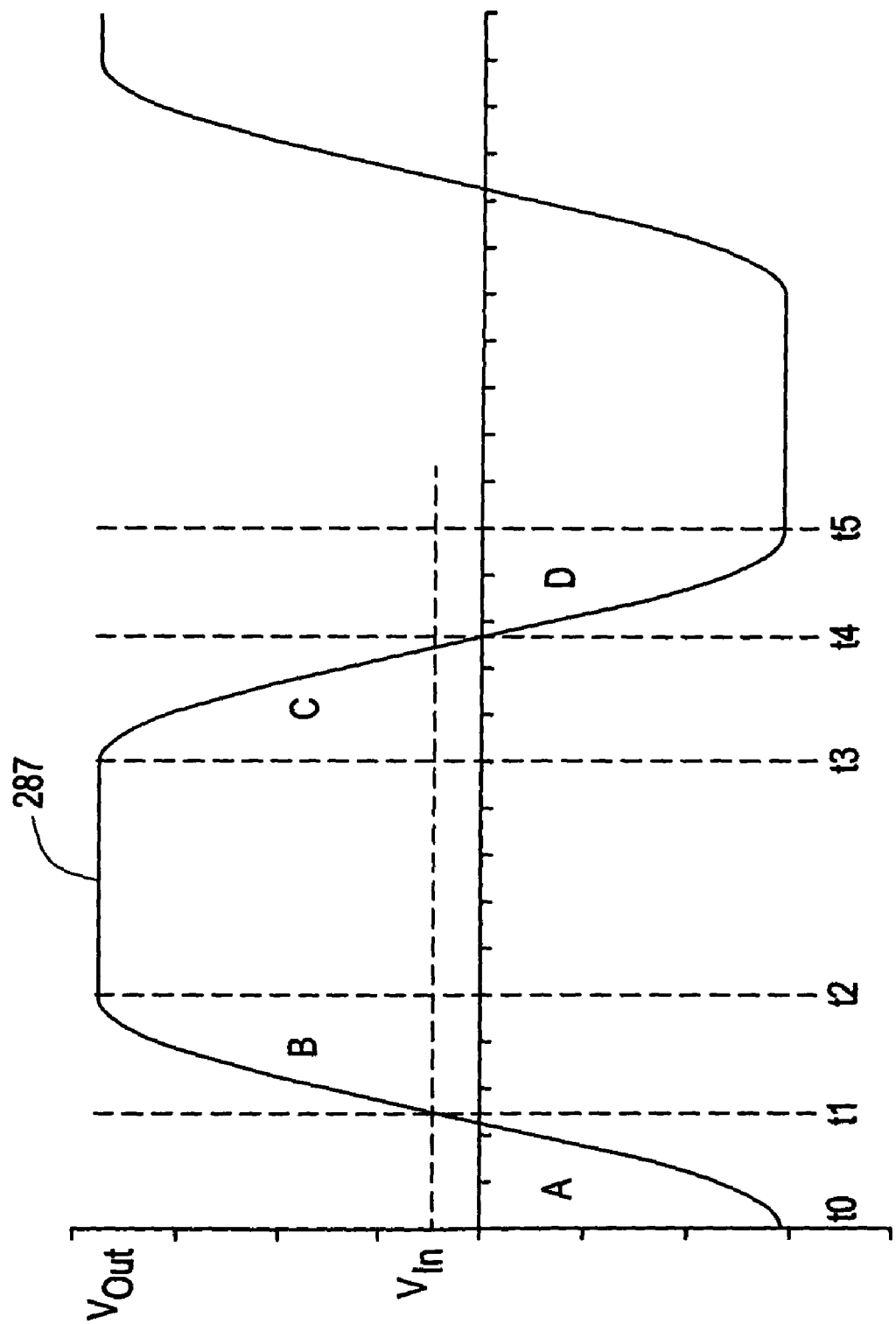
FIG. 9 is a waveform schematic of a portion of the waveform of FIG. 5.
Figure 10:
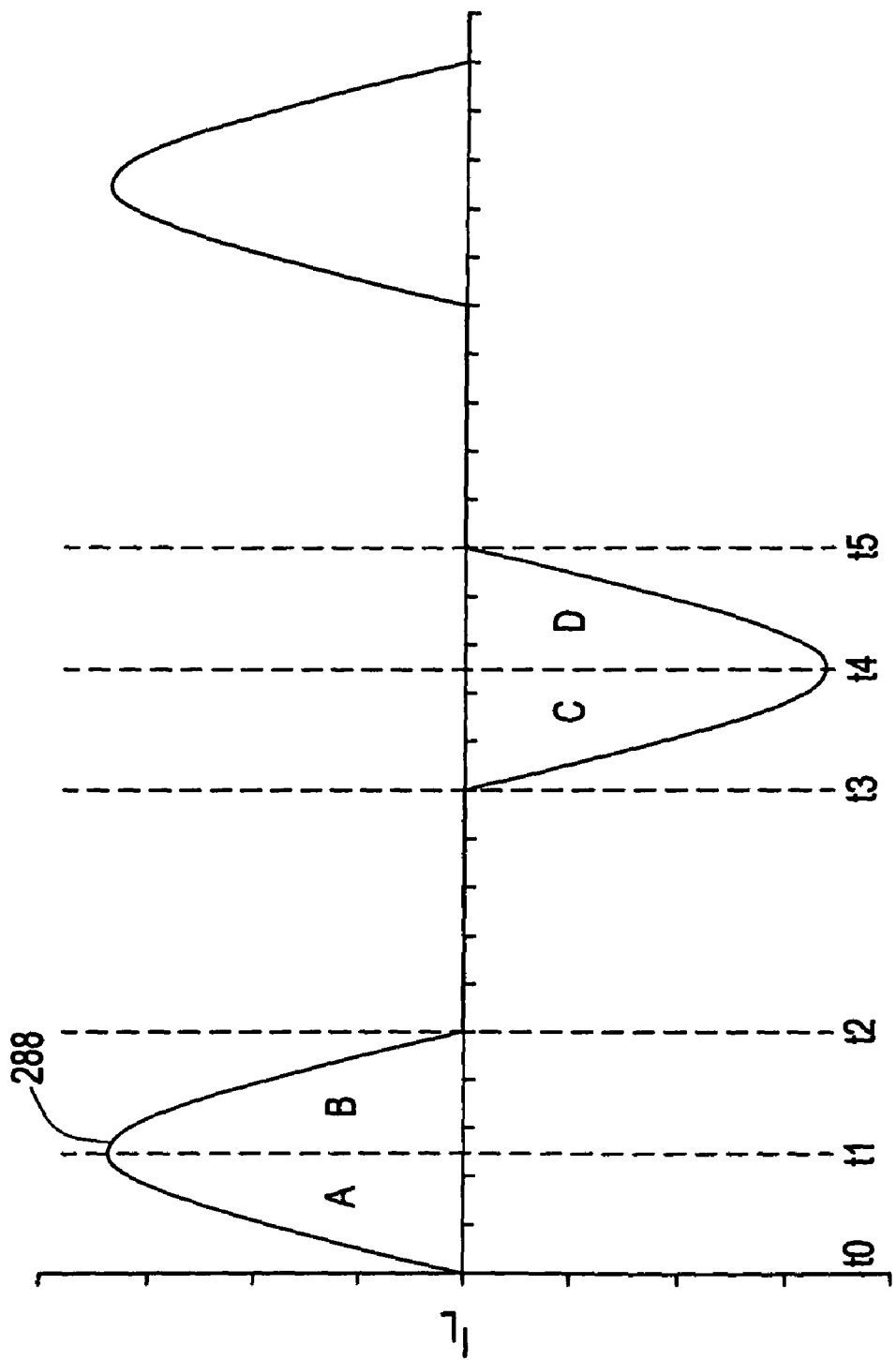
FIG. 10 is a waveform schematic of a portion of the waveform of FIG. 6.

Referring to FIGS. 9 and 10, enlarged portions of the waveforms 287, 288 will be utilized to provide a more detailed explanation of the energy recovery functionality of the optically powered drive circuit 198. Region A is defined as the time interval between times t0 and t1; region B is the time interval between times t1 and t2; region C is the time interval between times t3 and t4; and region D is the time interval between times t4 and t5.

The rate of change of a current flowing through the inductor 256 is directly proportional to the difference in voltage between the nodes 248 and 250 and is indirectly proportional to the inductance value of the inductor 256. Thus, if the voltage at the node 248 is greater than the voltage at the node 250, the current through the inductor 256 increases. Similarly, if the voltage at the node 248 is less than the voltage at the node 250, the current through the inductor 256 decreases. If the voltage at the node 248 equals the voltage at the node 250, the current through the inductor 256 remains a constant value.

The rate of change of the voltage at the terminals of the capacitor 282 is directly proportional to the current through the inductor 256 and indirectly proportional to capacitance value of the capacitor 282. Thus, if the current through the inductor 256 is positive, the voltage at the node 250 increases. Similarly, if the current through the inductor 256 is negative, the voltage at the node 250 decreases. If there is no current through the inductor 256, the voltage at the node 250 remains stable.

Referring to region A of FIGS. 9 and 10, a time t0 designates the point in time when the switch 210 closes. Since the inductor 256 resists a non-continuous change in current, the current through the inductor 256 cannot instantaneously jump to a different value at time t0. Similarly, since the capacitor 252 resists a non-continuous change in the voltage between its terminals, the voltage between the nodes 250 and 80 also cannot instantaneously jump to a different value at time t0. Thus, immediately after the switch 210 closes, the current through inductor 252 retains its previous value of zero and the voltage at the node 250 retains its previous negative value. Further, the voltage at the node 248 jumps to a value nearly equal to the voltage at the node 238.

Because the voltage at the node 248 is greater than the voltage at the node 250, the current through the inductor 256 begins to increase in the positive direction. When positive current begins to flow through the inductor 256, electrical charge is transferred to the node 250, and thus, the voltage at the node 250 begins to increase. Therefore in region A, the current through the inductor 256 increases while the voltage at the node 250 also increases. Time t1 designates the time when the voltage at the node 248 equals the voltage at the node 250. At this time, the current through the inductor 256 reaches its maximum positive value.

Referring to Region B of FIGS. 9 and 10, at time t1, since positive current is still flowing in the inductor 256 from the node 248 to the node 250, the node 250 continues to be charged after time t1 to a voltage greater than the voltage at the node 248. Because the voltage at the node 250 is now greater than the voltage at the node 248, the current flowing through the inductor 256 begins to decrease. Although the current is decreasing, it is still a positive current transferring charge from the node 248 to the node 250, and thus, the voltage at node 250 continues to increase. Therefore in region B, the current through the inductor 256 is positive but decreasing, while the voltage at the node 250 continues to increase. Time t2 designates the time when the current through the inductor 256 decreases to zero. At time t2, the voltage at the node 250 reaches its maximum positive value. Further, the voltage at the node 250 is significantly greater than the voltage at the node 248 because the circuit has transferred energy through the resonant circuit, consisting of inductor 256 and capacitor 282 from the voltage source 278 to the capacitor 282.

Because the voltage at the node 250 is greater than the voltage at the node 238, the current through the inductor 256 would begin to increase in the negative direction if diode 252 was not present. The diode 252, however, prevents a negative current from flowing through the inductor 256, thus preventing node 250 from discharging through the inductor 256.

Referring to Region C in FIGS. 9 and 10, the time t3 designates a time when the switch 212 closes. Immediately after switch 212 closes, the current through the inductor 256 retains its previous value of zero and the voltage at the node 250 retains its previous value, which is relatively large and positive. Further, the voltage at the node 248 becomes nearly the same voltage as node 80. Thus, there is a negative voltage across the inductor, equal to the capacitor 282 voltage at node 250.

Because the voltage at the node 248 is less than the voltage at the node 250, the magnitude of the current through the inductor 256 increases in the negative direction. When negative current begins to flow through the inductor 256, electrical charge is transferred from the node 250 to the node 248, and thus, the voltage at the node 250 begins to decrease. Therefore in region C, the magnitude of the negative current through the inductor 256 increases while the voltage at the node 250 decreases. Time t4 designates the moment when the voltage at the node 248 equals the voltage at the node 250. At time t4, the current through the inductor 256 reaches its maximum negative value.

Referring to Region D in FIGS. 9 and 10, at time t4, a negative current is still flowing in inductor 256. Because the voltage at the node 248 is now more positive than the voltage at the node 250, the magnitude of the negative current through the inductor 256 begins to decrease. Although the magnitude of the current is decreasing, it is still a negative current transferring electrical current from the node 250 towards node 248, and thus, the voltage at the node 250 continues to decrease. Therefore in region D, the magnitude of the negative current decreases while the capacitor voltage continues to also decrease. Time t5 designates the moment when the magnitude of the negative current through inductor 256 reaches zero. At time t5, the capacitor 282 voltage reaches its maximum negative value. Further, just before the inductor 256 current reaches zero, the voltage at node 248 is significantly greater than the voltage at the node 250. Because the voltage across capacitor 282 is negative, and inductor 256 current is now zero, the current through the inductor 256 would begin to increase in the positive direction if the diode 254 was not present. The diode 254, however, prevents a positive current from flowing through the inductor 256, thus preventing the capacitor 282 from discharging through the inductor 256.

Figure 11:
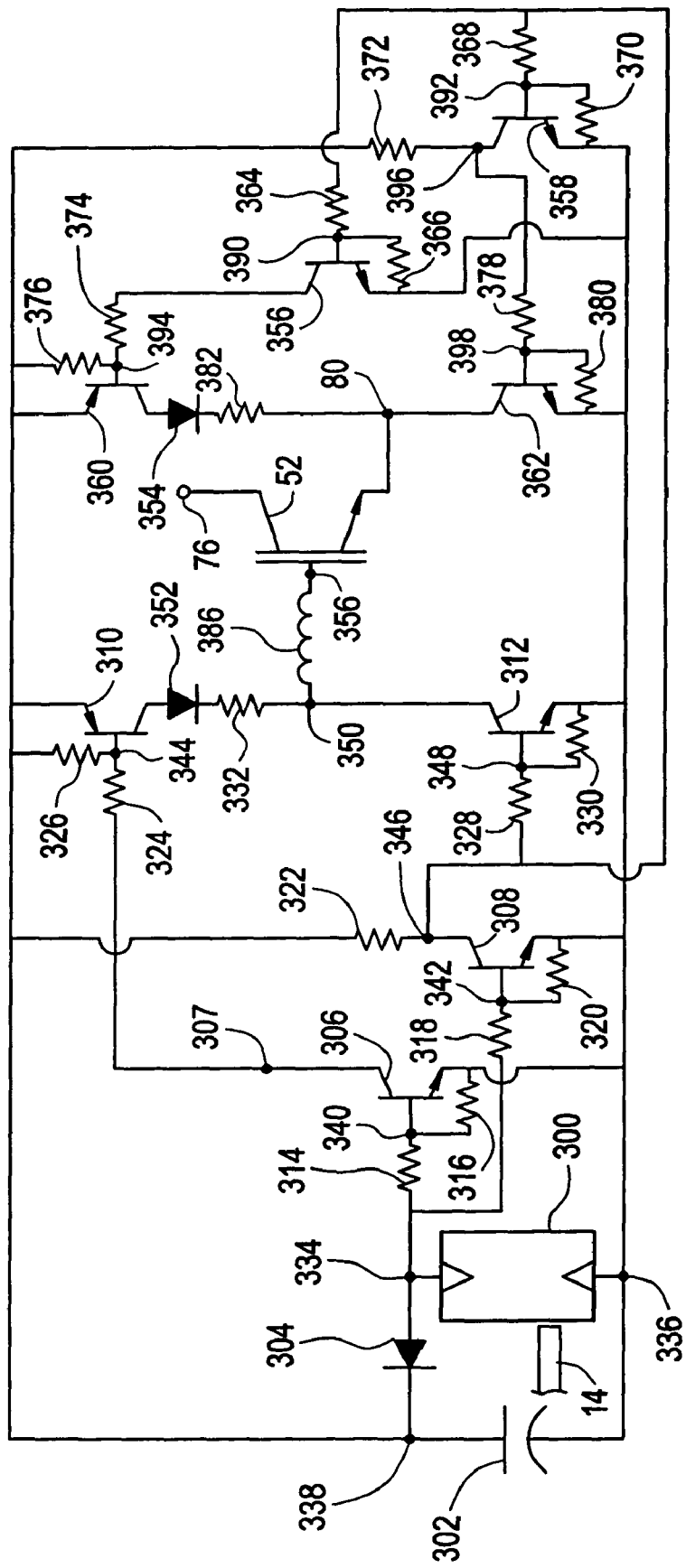
FIG. 11 is a schematic of a resonant full bridge optically powered drive circuit in accordance with another exemplary embodiment.

Referring to FIG. 11, a schematic of a resonant full bridge optically powered drive circuit 301 that can be utilized in control system 10 instead of the optically powered drive circuit 40, accordance with another exemplary embodiment is shown. The optically powered drive circuit 301 includes a photovoltaic cell 300, a capacitor 302, diodes 304, 352, 354, an inductor 386, transistors 306, 308, 310, 312, 356, 358, 360, 362, and resistors 314, 316, 318, 320, 322, 324, 326, 328, 330, 332, 364, 366, 368, 370, 372, 374, 376, 378, 380, 382. For FIG. 11, all voltages are with respect to node 336, unless otherwise specified.

The photovoltaic cell 300 is provided for converting light energy received from the fiber optic cable 14 into electrical energy by generating a voltage between nodes 334 and 336. The photovoltaic cell 300 outputs a relatively high voltage at the node 334 when light is being received from the fiber optic cable 14 and outputs a low voltage at node 334 when light is not being received by the fiber optic cable 14.

The capacitor 302 is provided for storing electrical energy generated by the photovoltaic cell 300. The capacitor 302 is electrically coupled to the photovoltaic cell at node 336 and to the diode 304 at the node 338.

The diode 304 is provided to prevent the capacitor 302 from discharging when the photovoltaic cell 300 is not receiving light from the fiber optic cable 14. The anode of diode 304 is electrically coupled to the photovoltaic cell 300 at the node 334. The cathode of diode 304 is electrically coupled to the capacitor 302 at a node 338. The diode 304 is configured to allow current to flow from the photovoltaic cell 300 to the capacitor 302.

The transistors 306, 308, 310, 312, 356, 358, 360, 362 are provided for switching transistor 52 between two operational states based upon the voltage at the node 334. The transistors 306, 308, 312, 356, 358, and 362 are NPN transistors and operate in a manner similar as transistor 106 described above. The transistors 310 and 360 are PNP transistors and operate in a manner similar as transistor 110 as described above.

The transistors 310 and 362 are provided to charge a node 356 with respect to node 80, generating a voltage between nodes 356 and 80 suitable to resonantly charge the base capacitance of the transistor 52 to turn transistor 52 on. The transistors 312 and 360 are provided to discharge the node 356 with respect to node 80, generating a voltage between nodes 356 and 80 suitable to resonantly discharge the base capacitance of the transistor 52 to turn transistor 52 off. The transistor 306 is provided to induce the transistor 310 to turn on when a high voltage is received at a node 334 and to induce the transistor 310 to turn off when a low voltage is received at the node 334. The transistor 308 is provided to induce the transistor 312 to turn off when a high voltage is received at a node 334 and to induce the transistor 312 to turn on when a low voltage is received at a node 334. The transistor 356 is provided to induce the transistor 360 to turn on when a high voltage is received at a node 346 and to induce the transistor 360 to turn off when a low voltage is received at the node 346. The transistor 358 is provided to induce the transistor 362 to turn off when a high voltage is received at a node 346 and to induce the transistor 362 to turn on when a low voltage is received at the node 346.

The transistor 306 is electrically coupled to the node 340 at the base terminal, a node 336 at the emitter terminal, and a node 344 through the resistor 324 at the collector terminal. The transistor 308 is electrically coupled to a node 342 at a base terminal, the node 336 at an emitter terminal, and a node 346 at a collector terminal. The transistor 310 is electrically coupled to a node 344 at a base terminal, a node 338 at an emitter terminal, and a node 350 through the diode 352 and the resistor 332 at a collector terminal. The transistor 312 is electrically coupled to a node 348 at the base terminal, a node 336 at an emitter terminal and a node 350 at a collector terminal. The transistor 356 is electrically coupled to a node 390 at a base terminal, a node 336 at an emitter terminal, and a node 394 through the resistor 374 at a collector terminal. The transistor 358 is electrically coupled to a node 392 at a base terminal, the node 336 at an emitter terminal, and a node 396 at the collector terminal. The transistor 360 is electrically coupled to the node 394 at a base terminal, the node 338 at an emitter terminal, and a node 80 through the diode 354 and the resistor 382 at a collector terminal. The transistor 362 is electrically coupled to a node 398 at a base terminal, the node 336 at an emitter terminal, a node 80 at a collector terminal.

The inductor 386 is provided to charge node 356 relative to node 80 to a voltage greater than the voltage at the node 350 relative to node 80 when the transistor 310 is turned on and to discharge node 356 relative to node 80 to a voltage less than the voltage at the node 350 relative to node 80 when the transistor 312 is turned off. The inductor 386 is electrically coupled in series between the nodes 350 and 356.

The diodes 352 and 354 are provided to prevent the node 356 from discharging when the transistor 312 is turned off and to prevent the node 356 from recharging when the transistor 310 is turned off. The diode 352 is electrically coupled to a collector of the transistor 310, at an anode terminal and to the node 350 through resistor 332 at a cathode terminal. The diode 352 is configured to allow current to pass from the transistor 310 to the inductor 386. The diode 354 is electrically coupled to a collector of transistor 360 at an anode terminal and to the node 80 through resistor 382 at a cathode terminal. The diode 354 is configured to allow current to pass from the transistor 360 to the node 80.

The resistor 314 is connected in series between the nodes 334 and 340. The resistor 316 is connected in series between the nodes 340 and 336. The resistor 318 is connected in series between the nodes 334 and 342. The resistor 320 is connected in series between the nodes 342 and 336. The resistor 322 is connected in series between the nodes 338 and 346. The resistor 324 is connected in series between the node 344 and a collector of the transistor 306. The resistor 326 is connected in series between the nodes 338 and 344. The resistor 328 is connected in series between the nodes 346 and 348. The resistor 330 is connected in series between the nodes 348 and 336. The resistor 332 is connected in series between the node 350 and a collector of transistor 310 through the diode 352. The resistor 364 is connected in series between the nodes 346 and 390. The resistor 366 is connected in series between the nodes 390 and 336. The resistor 368 is connected in series between the nodes 346 and 392. The resistor 370 is connected in series between the nodes 392 and 336. The resistor 372 is connected in series between the nodes 338 and 396. The resistor 374 is connected in series between the node 394 and a collector of transistor 356. The resistor 376 is connected in series between the nodes 338 and 394. The resistor 378 is connected in series between the nodes 396 and 398. The resistor 380 is connected in series between the nodes 398 and 336. The resistor 382 is connected in series between the node 80 and a collector of the transistor 360 through the diode 354.

The operation of the resonant full bridge optically powered drive circuit 301 will now be explained. When the photovoltaic cell 300 receives light from the fiber optic cable 14, the photovoltaic cell 300 converts the light energy into a voltage at node 334 corresponding to a high voltage at node 334 relative to node 336. The diode 304 allows the voltage at the node 334 to charge the capacitor 302 generating a high voltage at the node 338. The high voltage at the node 334 induces the transistors 306 and 308 to turn on. When the transistors 306 and 308 turn on, the nodes 307 and 346 transition from a high voltage to a low voltage inducing the transistor 310 to turn on and the transistor 312 to turn off. The low voltage at the node 346 also induces the transistors 356 and 358 to turn off further inducing the transistor 360 to turn off and the transistor 362 to turn on. Transistors 310 and 362 turned on allows current to pass from the node 338 to the node 350, to node 356, to node 80, to node 336, and through capacitor 302 back to node 338. The diode 352 prevents current from reversing into node 356 from discharging through the inductor 358 while the transistors 312 and 360 are turned off. As described earlier, during this time the inductor 356 resonates with the base capacitance of transistor 52 to turn transistor 52 on.

Similarly, when the photovoltaic cell 300 does not receive light from the fiber optic cable 14, the photovoltaic cell 300 generates a voltage at node 334 relative to node 336 corresponding to a low voltage at the node 334 arelative to node 336. The diode 304 prevents the capacitor 302 from being discharged through the node 334. The low voltage at the node 334 induces the transistors 306 and 308 to turn off. When the transistors 306 and 308 turn off, the nodes 307 and 346 transition from a low voltage to a high voltage inducing the transistor 310 to turn off and the transistor 312 to turn on. The high voltage at the node 346 also induces the transistors 356 and 358 to turn on further inducing the transistor 360 to turn on and the transistor 362 to turn off. The transistor 312 allows current to pass from the node 350 to the node 336 discharging the node 350. Transistors 360 and 312 both turn on and allow current to pass from node 338 to the node 80, through the base capacitance of transistor 52, to node 356, to node 350, to node 336, and back to node 338 through capacitor 302. The diode 354 prevents node 356 from recharging while transistors 310 and 362 are turned off. As described earlier, during this time the inductor 356 resonates with the base capacitance of transistor 52 to turn transistor 52 off.

Figure 12:
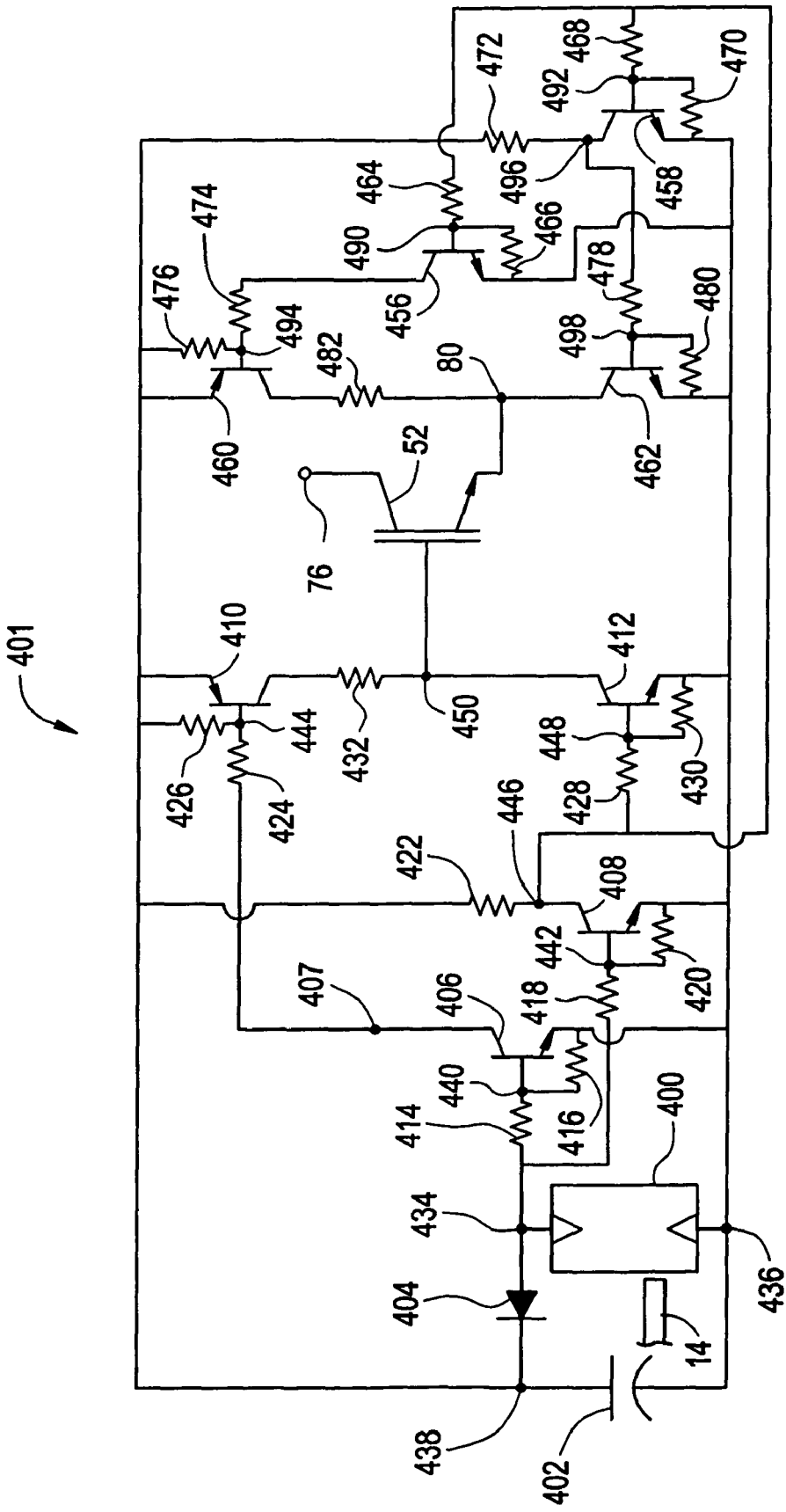
FIG. 12 is a schematic of a full bridge optically powered drive circuit in accordance with another exemplary embodiment.

Referring to FIG. 12, a schematic of a full bridge optically powered drive circuit 401 that can be utilized in control system 10 instead of the optically powered drive circuit 40, in accordance with another exemplary embodiment is shown. The optically powered drive circuit 40 includes a photovoltaic cell 400, a capacitor 402, a diode 404, transistors 406, 408, 410, 412, 456, 458, 460, 462, and resistors 414, 416, 418, 420, 422, 424, 426, 428, 430, 432, 464, 466, 468, 470, 472, 474, 476, 478, 480, 482. For FIG. 12, all voltages are with respect to node 436, unless otherwise specified.

The photovoltaic cell 400 is provided for converting light energy received from the fiber optic cable 14 into electrical energy by generating a voltage at node 434 relative to node 436. The photovoltaic cell 400 outputs a high voltage at node 434 when light is being received from the fiber optic cable 14 and outputs a low voltage at the node 434 when light is not being received by the fiber optic cable 14.

The capacitor 402 is provided for storing electrical energy generated by the photovoltaic cell 400. The capacitor 402 is electrically coupled to the photovoltaic cell at the node 436 and to the diode 404 at a node 438.

The diode 404 is provided to prevent the capacitor 402 from discharging when the photovoltaic cell 400 is not receiving light from the fiber optic cable 14. An anode of diode 404 is electrically coupled to the photovoltaic cell 400 at the node 434. A cathode of the diode 404 is electrically coupled to the capacitor 402 at the node 438. The diode 404 is configured to allow current to flow from the photovoltaic cell 400 to the capacitor 402.

The transistors 406, 408, 410, 412, 456, 458, 460, 462 are provided for switching transistor 52 between two operational states based upon the voltage at the node 434. The transistors 406, 408, 412, 456, 458, and 462 are NPN transistors and operate in a manner similar as the transistor 106 described above. The transistors 410 and 460 are PNP transistors and operate in a manner similar as the transistor 110 described above.

The transistors 410 and 462 are provided to charge a node 450 relative to node 80, generating a positive voltage between the nodes 450 and 80 suitable to induce the transistor 52 to turn on. The transistors 412 and 460 are provided to generate a negative voltage between node 450 and node 80, generating a voltage between the nodes 450 and 80 suitable to induce the transistor 52 to turn off. The transistor 406 is provided to induce the transistor 410 to turn on when a high voltage is received at a node 434 and to induce the transistor 410 to turn off when a low voltage is received at the node 434. The transistor 408 is provided to induce the transistor 412 to turn off when a high voltage is received at a node 434 and to induce the transistor 412 to turn on when a low voltage is received at the node 434. The transistor 456 is provided to induce the transistor 460 to turn on when a high voltage is received at a node 446 and to induce the transistor 460 to turn off when a low voltage is received at the node 446. The transistor 458 is provided to induce the transistor 462 to turn off when a high voltage is received at a node 446 and to induce the transistor 462 to turn on when a low voltage is received at the node 446.

The transistor 406 is electrically coupled to the node 440 at a base terminal, the node 436 at an emitter terminal, and a node 407 at the collector terminal. The transistor 408 is electrically coupled to the node 442 at a base terminal, the node 436 at an emitter terminal, and a node 446 at a collector terminal. The transistor 410 is electrically coupled to the node 444 at a base terminal, the node 438 at an emitter terminal, and the node 450 through the resistor 432 at a collector terminal. The transistor 412 is electrically coupled to a node 448 at a base terminal, the node 436 at an emitter terminal, and the node 450 at a collector terminal. The transistor 456 is electrically coupled to a node 490 at a base terminal, the node 436 at an emitter terminal, and a node 494 through the resistor 474 at a collector terminal. The transistor 458 is electrically coupled to the node 492 at a base terminal, the node 436 at an emitter terminal, and a node 496 at a collector terminal. The transistor 460 is electrically coupled to the node 494 at a base terminal, the node 438 at an emitter terminal, and the node 80 through the resistor 482 at a collector terminal. The transistor 462 is electrically coupled to a node 498 at a base terminal, the node 436 at an emitter terminal and the node 80 at a collector terminal.

The resistor 414 is connected in series between the nodes 434 and 440. The resistor 416 is connected in series between the nodes 440 and 436. The resistor 418 is connected in series between the nodes 434 and 442. The resistor 420 is connected in series between the nodes 442 and 436. The resistor 422 is connected in series between the nodes 438 and 446. The resistor 424 is connected in series between the node 444 and a collector of transistor 406. The resistor 426 is connected in series between the nodes 438 and 444. The resistor 428 is connected in series between the nodes 446 and 448. The resistor 430 is connected in series between the nodes 448 and 436. The resistor 432 is connected in series between the node 450 and a collector of the transistor 410. The resistor 464 is connected in series between the nodes 446 and 490. The resistor 466 is connected in series between the nodes 490 and 436. The resistor 468 is connected in series between the nodes 446 and 492. The resistor 470 is connected in series between the nodes 492 and 436. The resistor 472 is connected in series between the nodes 438 and 496. The resistor 474 is connected in series between the node 494 and a collector of the transistor 456. The resistor 476 is connected in series between the nodes 438 and 494. The resistor 478 is connected in series between the nodes 496 and 498. The resistor 480 is connected in series between the nodes 498 and 436. Finally, the resistor 482 is connected in series between the node 80 and a collector of transistor 460.

The operation of the full bridge optically powered drive circuit 401 will now be explained. When the photovoltaic cell 400 receives light from the fiber optic cable 14, the photovoltaic cell 400 converts the light energy into a voltage between the nodes 434 and 436 corresponding to a high voltage at the node 434 relative to node 436. The diode 404 allows the voltage at the node 434 to charge the capacitor 402 generating a high voltage at the node 438. The high voltage at the node 434 induces the transistors 406 and 408 to turn on. When the transistors 406 and 408 turn on, the nodes 407 and 446 transition from a high voltage to a low voltage inducing the transistor 410 to turn on and the transistor 412 to turn off. The low voltage at the node 446 also induces the transistors 456 and 458 to turn off further inducing the transistor 460 to turn off and the transistor 462 to turn on. The transistor 462 allows current to pass from the node 80 to the node 436 discharging the node 80. The transistor 410 allows current to pass from the node 438 to the node 450, through the base capacitance of transistor 52, through transistor 462, and through capacitor 402 back to node 438. This charges node 450 relative to node 80 to a positive voltage sufficient to induce the transistor 52 to turn on.

Similarly, when the photovoltaic cell 400 does not receive light from the fiber optic cable 14, the photovoltaic cell 400 generates a voltage between the nodes 434 and 436 corresponding to a low voltage at the node 434 relative to node 436. The diode 404 prevents the capacitor 402 from being discharged through the node 434. The low voltage at the node 434 induces the transistors 406 and 408 to turn off. When the transistors 406 and 408 turn off, the nodes 407 and 446 transition from a low voltage to a high voltage inducing the transistor 410 to turn off and the transistor 412 to turn on. The high voltage at the node 446 also induces the transistors 456 and 458 to turn on further inducing the transistor 460 to turn on and the transistor 462 to turn off. Transistors 460 and 412 turned on allow electrical current to pass from the node 438 to the node 80, through the base capacitance of transistor 52, through transistor 412, and through capacitor 402 back to node 438. This charges node 450 relative to node 80 to a negative voltage sufficient to induce the transistor 52 to turn off.

Figure 13:
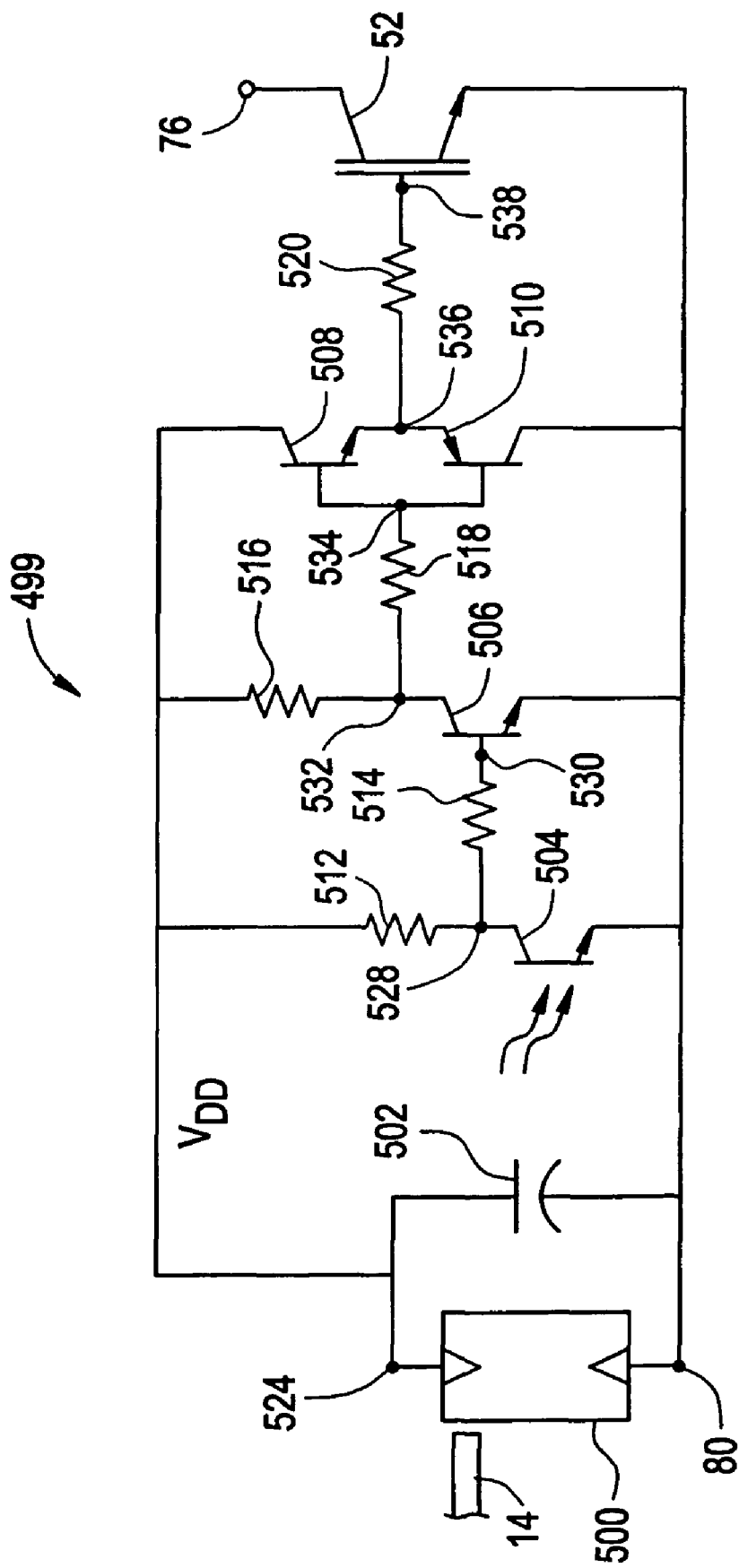
FIG. 13 is a schematic of an optically powered drive circuit in accordance with another exemplary embodiment.

Referring to FIG. 13, a schematic of an optically powered drive circuit 499 that can be utilized in control system 10 instead of the optically powered drive circuit 40, in accordance with another exemplary embodiment is shown. The optically powered drive circuit 40 includes a photovoltaic cell 500, a capacitor 502, transistors 504, 506, 508, 510, resistors 512, 514, 516, 518, 520.

The photovoltaic cell 500 is provided for converting light energy received from the fiber optic cable 14 into electrical energy by generating a voltage between nodes 524 and 80. The photovoltaic cell 500 outputs a high voltage at node 524 when light is being received from the fiber optic cable 14 and outputs a low voltage at node 524 when light is not being received by the fiber optic cable 14.

The capacitor 502 is provided for storing electrical energy generated by the photovoltaic cell 500. The capacitor 502 is electrically coupled to the photovoltaic cell at the nodes 524 and 80.

The transistors 504, 506, 508, 510 are provided for switching transistor 52 between two operational states based upon the voltage at a node 528. The transistors 504, 506, and 508 are NPN transistors and operate in a manner similar to the transistor 106 as described above. The transistor 510 is a PNP transistor and operates in a manner similar to the transistor 110 as described above.

The transistor 508 is provided to charge a node 538 to a voltage suitable to induce transistor the 52 to turn on. The transistor 510 is provided to discharge the node 538 to a voltage suitable to induce the transistor 52 to turn off. The transistor 506 is provided to induce the transistor 508 to turn on and the transistor 510 to turn off when a low voltage is received at node 530 and to induce the transistor 508 to turn off and transistor 510 to turn on when a high voltage is received at the node 530. The transistor 504 is provided to induce the transistor 506 to turn off when light is being received at a base terminal and to induce the transistor 506 to turn on when light is not being received at the base terminal.

The transistor 504 is electrically coupled to an optical fiber of fiber optic cable 14 at a base terminal, the node 80 at an emitter terminal, and the node 528 at a collector terminal. The transistor 506 is electrically coupled to the node 530 at a base terminal, the node 426 at an emitter terminal, and a node 532 at a collector terminal. The transistor 508 is electrically coupled to a node 534 at the base terminal, a node 536 at an emitter terminal, and the node 524 at a collector terminal. The transistor 510 is electrically coupled to the node 534 at a base terminal, the node 536 at an emitter terminal, and the node 80 at a collector terminal.

The resistor 512 is connected in series between the nodes 524 and 528. The resistor 514 is connected in series between the nodes 528 and 530. The resistor 516 is connected in series between the nodes 524 and 532. The resistor 518 is connected in series between the nodes 532 and 534. The resistor 520 is connected in series between the nodes 536 and 538.

The operation of the optically powered drive circuit 499 will now be explained. When the photovoltaic cell 500 receives light from an optical fiber of fiber optic cable 14, the photovoltaic cell 500 converts the light energy into a voltage between the nodes 524 and 80 corresponding to a high voltage at the node 524 relative to node 80. When the photovoltaic cell 500 does not receive light from an optical fiber of the fiber optic cable 14, the capacitor 502 maintains the high voltage at the node 524 for a limited period of time.

When the transistor 504 receives light from a second fiber optic cable at a base terminal, the transistor 504 turns on. When the transistor 504 turns on, the node 528 transitions from a high voltage to a low voltage. The low voltage at the node 528 induces the transistor 506 to turn off. When the transistor 506 turns off, the node 532 transitions from a low voltage to a high voltage. The high voltage at the node 532 induces the transistor 508 to turn on and the transistor 510 to turn off. The transistor 508 allows electrical current to pass from the node 524 to the node 536 charging the node 538, and inducing transistor 52 to turn on.

Similarly, when the transistor 504 does not receive light from a second fiber optic cable at a base terminal, the transistor 504 turns off. When the transistor 504 turns off, the node 528 transitions from a low voltage to a high voltage. The high voltage at the node 528 induces the transistor 506 to turn on. When the transistor 506 turns on, the node 532 transitions from a high voltage to a low voltage. The low voltage at node 532 induces the transistor 508 to turn off and the transistor 510 to turn on. The transistor 510 allows current to pass from the node 536 to the node 80 discharging the node 538, and inducing transistor 52 to turn off.

The optically powered drive circuits and methods disclosed herein provide a substantial advantage over other drive circuits and methods. In particular, the optically powered drive circuits have a technical effect of being powered and controlled via one or more light signals from a fiber optic cable, for controlling operation of a semiconductor switch coupled to the optically powered drive circuits.

While embodiments of the invention are described with reference to the exemplary embodiments, it will be understood by those skilled in the art that various changes may be made and equivalents may be substituted for elements thereof without departing from the scope of the invention. In addition, many modifications may be made to the teachings of the invention to adapt to a particular situation without departing from the scope thereof. Therefore, it is intended that the invention not be limited to the embodiment disclosed for carrying out this invention, but that the invention includes all embodiments falling within the scope of the intended claims. Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items.

The invention claimed is:

1. An optically powered drive circuit for controlling a first semiconductor switch, comprising:
    a photovoltaic cell configured to receive a first light signal from a first fiber optic cable and to generate a first voltage in response to the first light signal;
    a second semiconductor switch configured to receive a second light signal from a second fiber optic cable and to output a second voltage; and
    an electrical circuit electrically coupled to both the photovoltaic cell and the second semiconductor switch, the electrical circuit being powered by the first voltage, the electrical circuit being configured to output a third voltage for controlling operation of the first semiconductor switch in response to the second voltage such that the first semiconductor switch passes electrical energy from an energy source that is independent from the optically powered drive circuit;
    wherein the electrical circuit comprises a third semiconductor switch configured to transition the first semiconductor switch to a first operational state in response to the second voltage being received by the electrical circuit;
    wherein the electrical circuit further comprises a fourth semiconductor switch configured to transition the first semiconductor switch to a second operational state in response to the second voltage not being received by the electrical circuit.

2. The optically powered drive circuit of claim 1, wherein the first semiconductor switch energizes a load in response to the third voltage.

3. The optically powered drive circuit of claim 1, wherein the second semiconductor switch comprises a photo-responsive transistor.

4. The optically powered drive circuit of claim 1, wherein the first semiconductor switch comprises a transistor.

5. The optically powered drive circuit of claim 1, further comprising an energy recovery circuit configured to resonantly transfer energy from the electrical circuit to the first semiconductor switch in response to the first voltage being received by the electrical circuit.

6. The optically powered drive circuit of claim 5, wherein the energy recovery circuit comprises an inductor connected in series between the electrical circuit and the first semiconductor switch.

7. An optically powered drive circuit for controlling a first semiconductor switch, comprising:
    a photovoltaic cell configured to receive a first light signal from a first fiber optic cable and to generate a first voltage in response to the first light signal;
    a second semiconductor switch configured to receive a second light signal from a second fiber optic cable and to output a second voltage;
    an electrical circuit electrically coupled to both the photovoltaic cell and the second semiconductor switch, the electrical circuit being powered by the first voltage, the electrical circuit being configured to output a third voltage for controlling operation of the first semiconductor switch in response to the second voltage such that the first semiconductor switch passes electrical energy from an energy source that is independent from the optically powered drive circuit; and
    an energy recovery circuit configured to resonantly transfer energy from the electrical circuit to the first semiconductor switch in response to the first voltage being received by the electrical circuit,
    wherein the energy recovery circuit comprises an inductor connected in series between the electrical circuit and the first semiconductor switch.

* * * * *